United States Patent [19]
Meier et al.

[11] Patent Number: 4,994,346
[45] Date of Patent: Feb. 19, 1991

[54] NEGATIVE PHOTORESIST BASED ON POLYPHENOLS AND SELECTED EPOXY OR VINYL ETHER COMPOUNDS

[75] Inventors: Kurt Meier, Binningen; Martin Roth, Giffers; Adrian Schulthess, Tentlingen; Heinz Wolleb, Ependes, all of Switzerland

[73] Assignee: Ciba-Geigy Corporation, Ardsley, N.Y.

[21] Appl. No.: 221,846

[22] Filed: Jul. 20, 1988

[30] Foreign Application Priority Data

Jul. 28, 1987 [CH] Switzerland ............... 2871/87
Feb. 16, 1988 [CH] Switzerland ............... 546/88

[51] Int. Cl.$^5$ ............... G03C 1/68; G03C 1/71; G03C 1/727
[52] U.S. Cl. ............... 430/280; 430/325; 430/907; 430/914
[58] Field of Search ............... 430/926, 280, 292, 302, 430/280; 525/118; 568/723

[56] References Cited

U.S. PATENT DOCUMENTS 4,256,828  3/1981  Smith ............... 430/280
4,624,912  11/1986  Zwelpel et al. ............... 430/288

FOREIGN PATENT DOCUMENTS 124292  11/1984  European Pat. Off.
60-71657  4/1985  Japan.
2009435  6/1979  United Kingdom.

Primary Examiner—Paul R. Michl
Assistant Examiner—John S. Y. Chu
Attorney, Agent, or Firm—JoAnn Villamizar

[57] ABSTRACT

The present invention relates to a negative photoresist essentially comprising
(a) at least one solid, film-folrming polyphenol,
(b) at least one polyfunctional epoxy resin and/or one polyfunctional vinyl ether compound, each of which can be dissolved, in the uncured state, in aqueous alkaline media with salt formation,
(c) at least one cationic photoinitiator for component (b) and
(d) customary additives, if desired.

Components (a) and (b) can also be combined in one molecule. The resist can be developed in aqueous alkaline media.

17 Claims, No Drawings

NEGATIVE PHOTORESIST BASED ON POLYPHENOLS AND SELECTED EPOXY OR VINYL ETHER COMPOUNDS

The present invention relates to a composition essentially containing polyphenols and selected epoxy or vinyl ether compounds and photoinitiators, or essentially containing epoxy- or vinyl ether-modified polyphenols and photoinitiators, a process for the production of relief structures and protective coatings, and the use of said compositions as negative resist which can be developed in aqueous alkaline media.

Epoxide-based negative resists are known. In EP-A 153,904, a process is described for the production of protective coatings and relief structures in which a radiation-sensitive film of this type is used. The system is developed using organic solvents.

JP-A-60-71,657 discloses combinations of vinyl ether-modified novolaks and halonium salts which can be employed as photoresists. Due to the low content of phenolic OH groups, these combinations cannot be developed in aqueous alkaline media.

GB-A 2,009,435 discloses negative resists which can be developed in pure aqueous media, in which a water-soluble or swellable binder, inter alia poly(vinyl alcohol), and an acrylate monomer are used as the polymerizable components. Acrylate-based systems are generally inferior to epoxide systems with respect to the mechanical and electrical properties, temperature stability and adhesion to the substrate.

In addition, systems which can be developed in pure aqueous media are relatively moisture-sensitive and their storage stability is limited, in contrast to systems which can be developed in aqueous alkaline media or aqueous acidic media.

In EP-A 124,292, an aqueous dispersion of an epoxy resin and an onium photoinitiator is described. The composition is employed for the production of protective coatings and relief images and can be developed in aqueous media. Wetting agents or protective colloids, for example poly(vinyl alcohol), are preferably added to the dispersions. However, not all epoxy resins are suitable; thus, a reactive diluent has to be added in some cases in order to ensure dispersibility.

It has now been found that epoxy- or vinyl ether-based negative resists which can be developed in aqueous alkaline media can be produced by combining selected epoxy resins or vinyl ethers with polyphenol-based binders or by modifying polyphenols in a suitable manner with epoxy or vinyl ether functions. It has furthermore been found that mixtures of this type can be developed without problems and economically since the components in the non-crosslinked regions can be dissolved in the developer. A further advantage of the resists according to the invention is the great differentiation between the irradiated and non-irradiated regions. Thus, the resist can be developed out of the unexposed regions of the surface in a very short time without leaving residues and therefore does not interfere with the subsequent processing steps.

The present invention relates to a composition essentially comprising (a1) at least one solid, film-forming polyphenol,
(b1) at least one polyfunctional epoxy resin and/or a polyfunctional vinyl ether compound, each of which can be dissolved in the uncured state in an aqueous alkaline solution with salt formation,
(c1) at least one cationic photoinitiator for component (b1) and
(d1) customary additives, if desired.

The binder (a1) is a solid, film-forming polyphenol, i.e. a polymer which has a certain content of phenolic hydroxyl groups. This content should at least be sufficiently high so that development or at least swelling in an aqueous alkaline developer solution is ensured.

Suitable film-forming binders (a1) which are soluble in aqueous alkaline media can generally be divided into the following groups:

(i) novolaks prepared from at least one phenol and at least one aldehyde,
(ii) homopolymers and copolymers of alkenylphenols and, in particular,
(iii) homopolymers and copolymers of N-hydroxyphenylmaleiimides. Of these, groups (ii) and (iii) are preferred.

Preferred novolaks (i) are compounds which are derived from a $C_1$–$C_6$ aldehyde, for example formaldehyde and acetaldehyde, and from a dinuclear, but preferably mononuclear, substituted or unsubstituted phenol. Examples of preferred phenols are phenol itself or phenols which are substituted by one or two $C_1$–$C_9$ alkyl groups, for example o-, m- or p-cresol, xylenol, p-tert-butylphenol and o-, m- or p-nonylphenol, phenols which are substituted by one or two halogen atoms, preferably chlorine or bromine, for example p-chlorophenol, phenols which are substituted by a phenyl ring, for example p-phenylphenol, or phenols containing more than one phenolic group, for example resorcinol, bis(4-hydroxyphenyl)methane or 2,2-bis(4-hydroxyphenyl)propane.

Preferred homopolymers or copolymers of alkenylphenols (ii) are, in particular, the compounds of the formula I

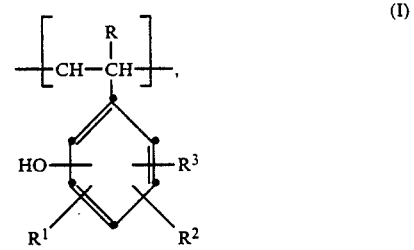

in which R is hydrogen or methyl, $R^1$, $R^2$ and $R^3$, independently of one another, are hydrogen, $C_1$–$C_4$alkyl, $C_1$–$C_4$ alkoxy, halogen, in particular chlorine or bromine, or methylol. The phenolic hydroxyl group is in the o-, m- or p-position to the alkenyl group, but preferably in the p-position.

Suitable comonomers are, for example, vinyl monomers which are free of carboxyl groups. Examples of such monomers are styrene, acrylates and methacrylates, in particular methyl (meth)acrylate or 2-hydroxyethyl (meth)acrylate, acrylamide, vinyl acetate and N-substituted maleimides.

The proportion of comonomer in the binder of type (ii) is preferably 0–50 mol %, relative to the total polymer.

Polymers of type (ii) are known and described, for example, in German Offenlegungsschrift 2,322,230 and in EP-A 153,682. Some of the polymers of this type are also commercially available.

Preferred binders of type (iii) are copolymers based on N-hydroxyphenylmaleiimides and vinyl monomers. The binders of type (iii) preferably contain the structural unit of the formula II

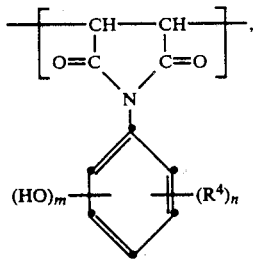

in which $R^4$ is $C_1$–$C_4$ alkyl, $C_1$–$C_4$ alkoxy or halogen, in particular chlorine or bromine, m is 1 or 2, n is 0, 1, 2, 3 or 4, and the sum of m and n is a maximum of 5, it being possible for the radicals $R^4$ of a phenyl ring to be different within the definitions given.

A further preferred group of binders of type (iii) are copolymers based on N-hydroxyphenylmaleiimides, in particular those containing structural elements of the formula II and vinyl compounds which are free of carboxyl groups.

Examples of suitable vinyl comonomers are:

(a) styrene compounds, for example styrene, α-methylstyrene, p-methylstyrene or p-hydroxyphenylstyrene;

(b) esters or amides of α,β-unsaturated acids, for example methyl acrylate, acrylamide, the corresponding methacrylyl compounds or methyl maleate;

(c) nitriles of α,β-unsaturated acids, for example acrylonitrile or methacrylonitrile;

(d) halogen-containing vinyl compounds, for example vinyl chloride, vinyl fluoride, vinylidene chloride or vinylidene fluoride;

(e) vinyl esters, for example vinyl acetate, or (f) vinyl ethers, for example methyl vinyl ether or butyl vinyl ether.

The proportion of the vinyl component in binders of type (iii) is generally 20 to 70 mol %, prefepably 40–60 mol %, particularly preferably about 50 mol %, relative to the total content of monomer units.

Homopolymers of structural units of the formula II and copolymers with vinyl compounds are known and described, for example, in Belgian Patent 613,801 and in Kobunshi Kagaku 26, 593–601 (1969) (Chem. Abstr. 72, 21964n). Furthermore, Turner et al., in Photopolymer Conference, Ellenville, Oct. 1985, pp. 35–47, report on the use of comonomers of this type with vinyl compounds as binders in positive photoresists.

A further preferred group of binders of type (iii) are copolymers based on N-hydroxyphenylmaleiimides, in particular those containing structural elements of the formula II, allyl compounds and, in some cases, further vinyl compounds.

These compounds are, in particular, copolymers containing 30–100 mol %, relative to the total polymer, of structural units of the formula II, as defined above, or of the formula III, the proportion of radicals of the formula II being 5 to 95 mol %, relative to the total amount of II and III,

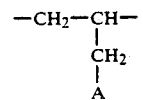

in which A is selected from the group of radicals comprising halogen, cyano or structural units of the formulae IV to IX

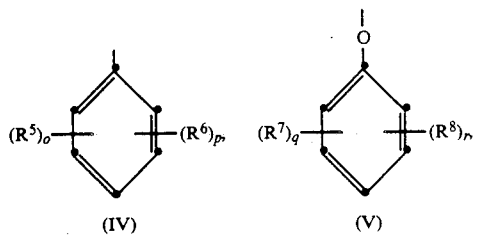

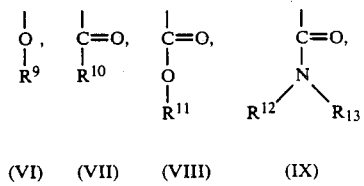

(VI)     (VII)     (VIII)     (IX)

in which $R^5$ and $R^7$, independently of one another, are hydroxyl or glycidyl groups of the formula Xa or Xb

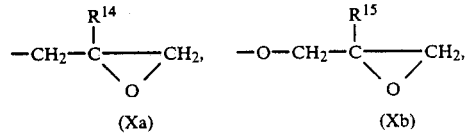

$R^6$ and $R^8$, independently of one another, are $C_1$–$C_4$ alkyl, $C_1$–$C_4$ alkoxy or halogen, o and q, independently of one another, are 0, 1, 2 or 3, p and r, independently of one another, are 0, 1, 2, 3, 4 or 5, where the sums o+p and q+r are in a maximum up to 5, $R^9$ is hydrogen, $C_1$–$C_{20}$ alkyl, a glycidyl radical of the formula Xa or a radical of the formula VII, $R^{10}$ is hydrogen, $C_1$–$C_{20}$ alkyl, cycloalkyl having 5 to 7 ring C atoms, phenyl, naphthyl or benzyl, $R^{11}$ is hydrogen, $C_1$–$C_{20}$ alkyl or a glycidyl radical of the formula Xa, and the groups $R^{12}$ and $R^{13}$, independently of one another, are hydrogen, $C_1$–$C_{20}$ alkyl, cycloalkyl having 5 to 7 ring C atoms, substituted or unsubstituted aryl or aralkyl, or a glycidyl radical of the formula Xa, or, together with the common nitrogen atom, form a five- or six-membered heterocyclic ring, and $R^{14}$ and $R^{15}$, independently of one another, are hydrogen or methyl, it being possible for the radicals $R^5$ to $R^{15}$ and A of a polymer molecule to be different within the definitions given.

Particularly preferred binders of type (iii) are copolymers containing 50–100 mol %, relative to the total polymer, of structural units of the formulae II and III. Particularly preferred binders of type (iii) are those essentially comprising structural elements of the formulae II and III, in which the proportion of elements II is 10–80 mol %, relative to the amount of II and III.

Very particularly preferred binders of type (iii) are copolymers containing structural units of the formulae II and III, as defined above, in which A is selected from the group comprising the radicals of the formulae IV, V, VI, VIII and IX, $R^5$ and $R^7$ are glycidyl groups of the formula Xa or Xb, $R^9$, $R^{11}$ and at least one of the radicals $R^{12}$ or $R^{13}$ is a glycidyl group of the formula Xa, and o and q, independently of one another, are 1, 2 or 3.

Particularly preferred binders of type (iii) are those which contain structural units of the formulae II and III, as defined above, in which A is a group of the formula VI and $R^9$ is a group of the formula Xa, or in which A is a group of the formula IV or V, $R^5$ and $R^7$ are glycidyl groups of the formula Xb, o and q are 1 or 2, and p and r are 0.

Further binders of type (iii) are copolymers containing at least 50 mol %, relative to the total polymer, of structural elements of the formulae II and III and, as the remainder, structural elements which are derived from carboxyl group-free vinyl compounds selected from the group comprising styrene compounds, esters or amides of $\alpha,\beta$-unsaturated acids, nitriles of $\alpha,\beta$-unsaturated acids, halogen-containing vinyl compounds, vinyl esters and vinyl ethers.

Copolymers of N-hydroxyphenylmaleiimides and allyl compounds have not been described hitherto.

They can be prepared by (a) free-radical polymerization of compounds of the formulae IIa and IIIa

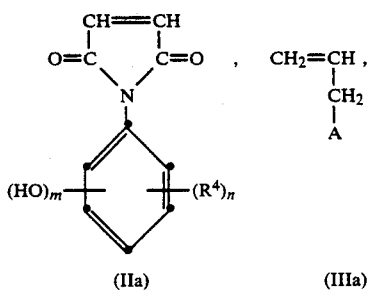

(IIa)    (IIIa)

in which $R^4$, A, m and n are as defined above, if desired in the presence of further monomers which can be free-radical polymerized, or (b) free-radical polymerization of compounds of the formulae IIb and IIIa

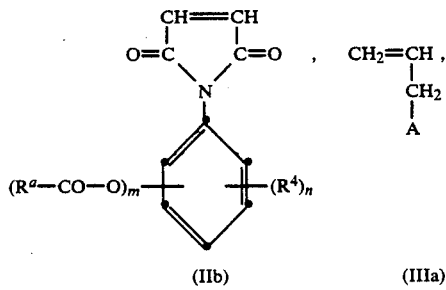

(IIb)    (IIIa)

in which $R^4$, A, m and n are as defined above, and $R^a$ is a monovalent hydrocarbon radical, preferably $C_1-C_4$ alkyl, if desired in the presence of further monomers which can be free-radical polymerized, and conversion of the product into a copolymer as defined above by hydrolysis of the $R^3$-CO-group.

The molecular weights of the N-(hydroxyphenyl)-maleiimide/allyl copolymers are generally between 500–100,000 (weight average).

The compounds of the formulae IIa and IIb are known per se or can be prepared by standard reactions. Further details in this respect can be found in U.S. Pat. No. 4,289,699. The allyl compounds of the formula IIIa are likewise known and some are commercially available.

$C_1-C_4$ Alkyl radicals $R^1$, $R^2$, $R^3$, $R^4$, $R^6$ and R8 are straight-chain or branched, preferably straight-chain, alkyl radicals. Examples of such groups are methyl, ethyl, n-propyl, isopropyl, n-butyl or sec-butyl. Methyl is preferred.

Examples of the alkyl moiety of $C_1-C_4$ alkoxy $R^1$, $R^2$, $R^3$, $R^4$, $R^6$ and $R^8$ are as defined as above. Methoxy is preferred.

Halogen $R^1$, $R^2$, $R^3$, $R^4$, $R^6$ and $R^8$ are fluorine, chlorine, bromine or iodine. Chlorine or bromine is preferred, in particular bromine.

Any $C_1-C_{20}$ alkyl radicals are preferably straight-chain groups. However, they may alternatively be branched alkyl groups.

Examples of $C_1-C_{20}$ alkyl radicals are methyl, ethyl, n-propyl, isopropyl, n-butyl, sec-butyl, tert-butyl, n-pentyl, isopentyl, n-hexyl, n-heptyl, n-octyl, 2-ethylhexyl, n-nonyl, n-decyl, n-undecyl, n-dodecyl, n-tetradecyl, n-hexadecyl, n-octadecyl or n-eicosyl. $C_1-C_8$Alkyl radicals of this type are preferred, in particular the straight-chain radicals and very particularly methyl or ethyl.

Halogen A is fluorine, chlorine, bromine or iodine. Chlorine or bromine, especially chlorine, is preferred.

$R^{10}$, $R^{12}$ and $R^{13}$ as cycloalkyl having 5 to 7 ring C atoms are generally cyclopentyl, cyclohexyl or cycloheptyl, but in particular cyclohexyl. These radicals are unsubstituted or alkyl-substituted.

Unsubstituted or substituted aryl $R^{12}$ and $R^{13}$ are, for example, phenyl or naphthyl. Suitable substituents are, for example, alkyl groups, in particular methyl, alkoxy groups, in particular methoxy, halogen atoms, in particular chlorine or bromine, or cyano groups.

Specific examples of substituted aryl radicals are o-, m- or p-tolyl, xylyl or chlorophenyl. The preferred aryl radical is phenyl.

Unsubstituted or substituted aralkyl $R^{12}$ and $R^{13}$ are, for example, benzyl, $\alpha$-methylbenzyl or $\alpha,\alpha$-dimethylbenzyl. Here again, suitable substituents are the radicals mentioned above as examples for aryl.

Specific examples of substituted aralkyl radicals are 4-methylbenzyl or 4-methoxybenzyl. Benzyl is preferred.

The index m in the structural element of the formula II is preferably 1 or 2, particularly preferably 1. The index n in the structural element of the formula II is preferably 0, 1 or 2, particularly preferably 0.

Component (b1) of the negative resist according to the invention contains at least one epoxy compound which is soluble in aqueous alkaline medium with salt formation and/or one soluble vinyl ether compound.

In the context of this invention, the epoxides or vinyl ethers employed as component (b1) are those which, in the uncured state, can be dissolved in the aqueous solution of a base with salt formation, even without combination with the said phenolic binder (a).

If desired, a mixture of epoxy resins or vinyl ethers in the compositions according to the invention can be used. In general, these epoxy resins or vinyl ether compounds are polyfunctional. It is also possible to employ relatively small amounts of monofunctional epoxy resins or vinyl ether compounds in combination with poly-functional epoxy resins or vinyl ether compounds.

Component (b1) can be relatively low-molecular-weight epoxy compounds containing further polar groups, such as hydroxyl groups. These groups must be present in a number, besides the epoxy groups, which ensures solubility in aqueous alkaline solutions. However, they may alternatively be relative high-molecular-weight compounds which contain, besides the epoxy groups or vinyl ether radicals, a number of polar groups which is sufficient to achieve water solubility.

Examples of preferred components (b1) are phenols containing epoxypropyl side groups or the phenols which have been partially etherified with glycidyl groups, for example partially-glycidylated novolaks based on phenol and formaldehyde or based on cresol and formaldehyde.

The preferred components (b1) include compounds of the formula XI

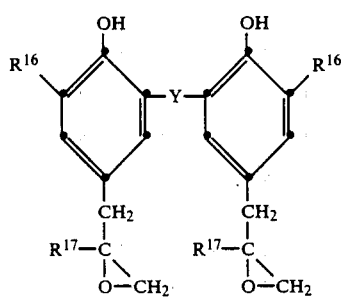
(XI)

in which $R^{16}$ is $C_1$-$C_6$ alkyl, Y is a direct C—C bond or a —CH$_2$—, —CH(CH$_3$)—, —C(CH$_3$)$_2$—, —O, —S—, —CO— or —SO$_2$— group, and $R^{17}$ is hydrogen or methyl. The compounds of the formula XI are novel and likewise subject-matter of the present invention.

Further preferred components (b1) are modified o-alkylphenol novolaks of the formula XII

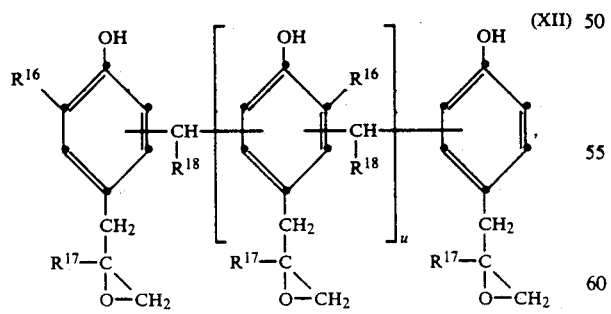
(XII)

in which $R^{16}$ and $R^{17}$ are as defined above, $R^{18}$ is hydrogen or $C_1$-$C_6$-alkyl, in particular methyl, and u is 1 to 6.

Further preferred components (b1) are modified phenol novolaks consisting essentially of structural units of the formulae XIII and XIV

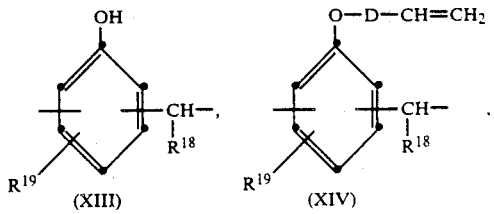
(XIII)   (XIV)

in which $R^{18}$ is as defined above, $R^{19}$ is hydrogen, $C_1$-$C_6$ alkyl, chlorine or bromine, D is a direct C—C bond or an —alkylene—O—group having 2-12 C atoms, and where the proportion of structural units of the formula XIII is sufficiently large so that the uncrosslinked compound is soluble in an aqueous alkaline solution with salt formation.

Further preferred components (b1) are modified polyhydroxystyrenes consisting essentially of structural units of the formulae XV and XVI or of structural units of the formulae XV and XVII

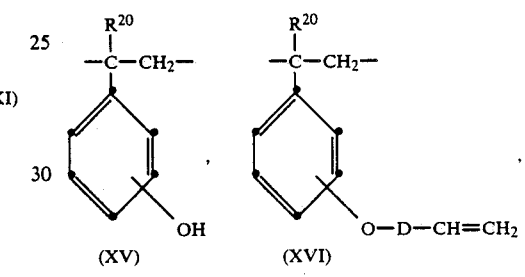
(XV)   (XVI)

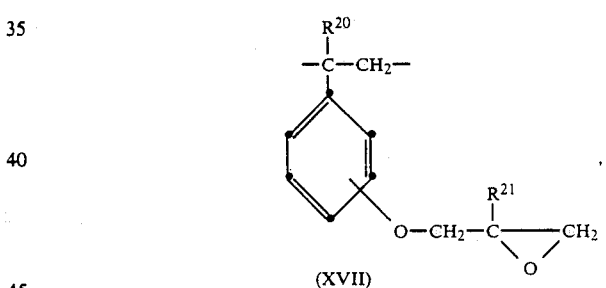
(XVII)

in which $R^{20}$ and $R^{21}$, independently of one another, are hydrogen or methyl, D is as defined above, and where the proportion of structural units of the formula XV is sufficiently large so that the uncrosslinked compound is soluble in an aqueous alkaline solution with salt formation.

These compounds are preferably modified poly-p-hydroxystyrenes.

It has furthermore been found that certain solid, film-forming polyphenols which are modified with epoxy or vinyl ether groups can be employed, even without component (b1), as negative resists which can be developed in aqueous alkaline media.

These are generally polyphenols of the components (a1) defined above, i.e. novolaks (i), polyalkenylphenols (ii) or poly-N-hydroxyphenylmaleiimides (iii), which are modified with a proportion of epoxy or vinyl ether groups such that adequate crosslinking takes place on exposure so that the resin in the exposed regions is now virtually insoluble in the aqueous alkaline developer, but which must contain a sufficiently high proportion of free phenolic hydroxyl groups so that the uncrosslinked resin can dissolve in an aqueous alkaline developer with salt formation. For this purpose, at least 30% of all the phenolic hydroxyl groups of the polyphenol should generally be free.

The invention thus also relates to a composition essentially comprising (a2) a solid, film-forming polyphenol which is modified with epoxy or vinyl ether groups and which has a content of free phenolic hydroxyl groups such that the uncrosslinked polyphenol dissolves in an aqueous alkaline developer with salt formation and which has a content of epoxy or vinyl ether groups such that the crosslinked polyphenol is now virtually insoluble in the said developer, (b2) a cationic photoinitiator for the polymerization of said epoxy or vinyl ether groups in component (a2), and (c2) customary additives, if desired.

Component (a2) is preferably a phenol novolak comprising 30–60% of structural units of the formula XIII and 70–40% of structural units of the formula XIV, or a modified polyhydroxystyrene comprising 30–60% structural units of the formula XV and 70–40% of structural units of the formula XVI, or a modified polyhydroxystyrene comprising 30–60% of structural units of the formula XV and 70–40% of structural units of the formula XVII, the percentages in each case relating to the total amount of structural units.

Phenols containing epoxypropyl side groups are prepared, for example, by reacting allyl phenol ethers or esters, for example 2,6-diallyphenol acetate, with peracids, for example peracetic acid, and subsequently hydrolysing the product.

The compounds of the formula XI can be obtained by epoxidation of the diacetates of the appropriate (meth)allyl compounds using peracids and subsequent hydrolysis to form the bisphenol. The (meth)allyl compounds can be obtained by Claisen's rearrangement of the corresponding (meth)allyl ethers. Examples of such reactions can be found in EP-A-14,816.

The compounds of the formula XII can be prepared in an analogous manner by starting from the novolaks on which compounds of the formula XII are based instead of the bisphenols on which compounds of the formula XI are based. The compounds containing structural units of the formulae XIII and XIV can be prepared by partial etherification of the basic novolaks using compounds of the type CH$_2$=CH—D—Cl where D is as defined above. Reactions of this type are described in JP-A-60-71,657.

The polyhydroxystyrenes consisting essentially of structural units of the formulae XV and XVI or of the formulae XV and XVII can be obtained from the polyhydroxystyrenes which are known per se by reaction of some of the phenolic hydroxyl groups with compounds of the type CH$_2$=CH—D—Cl, as defined above, or with epichlorohydrin.

Compounds which can be employed as component (c1) or (b2) of the mixture according to the invention are a large number of known and industrially proven cationic photoinitiators for epoxy resins. These are, for example, onium salts with anions of weak nucleophiles. Examples of these are halonium salts, as mentioned under the formula II in EP-A 153,904, iodosyl salts, as mentioned under the formula IV in EP-A 153,904, sulfonium salts, as mentioned under the formula III in EP-A 153,904, sulfoxonium salts, as described, for example, in EP-A 35,969, 44,274, 54,509 and 164,314, or diazonium salts, as described, for example, in US-A-3,708,296.

A review of further common onium salt initiators is given in "UV-Curing, Science and Technology" (Editor: S. P. Pappas, Technology Marketing Corp., 642 Westover Road, Stanford, Conn., USA).

Preferred photoinitiators are metallocene salts, as described, for example, in EP-A 94,914 and very particularly in EP-A 94,915.

The remarks in these publications are likewise the subject-matter of the present description.

Preferred photoinitiators include the compounds of the formulae XVIII, XIX and XX

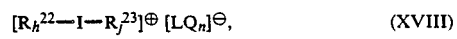

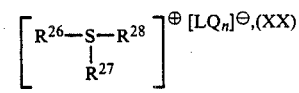

in which h is 1 and j is 1 or h is 2 and j is 0, and $R^{22}$ and $R^{23}$, in the case where h=1 and j=1, independently of one another are monovalent carbocyclic-aromatic $C_6$–$C_{18}$ radicals which are unsubstituted or substituted by one to three substituents, and $R^{22}$, in the case where h=2 and j=0, is a divalent carbocyclic-aromatic $C_{12}$–$C_{18}$ radical which is unsubstituted or substituted by one to three substituents, $R^{24}$, $R^{25}$, $R^{26}$, $R^{27}$ and $R^{28}$, independently of one another, have one of the definitions of $R^{23}$, L is selected from the group comprising B, P, As and Sb, Q is a halogen atom or some of the radicals Q in an anion $LQ_n^-$ may alternatively be hydroxyl groups, and n is an integer corresponding to one more than the valency of L.

Examples of monovalent carbocyclic-aromatic $C_6$–$C_{18}$ radicals are phenyl, naphthyl, anthryl and phenanthryl. Phenyl is preferred. Where present, substituents of these radicals are alkyl, preferably $C_1$–$C_6$ alkyl, such as methyl, ethyl, n-propyl, isopropyl, n-butyl, n-pentyl or n-hexyl, alkoxy, preferably $C_1$–$C_6$ alkoxy, such as methoxy, ethoxy, n-propoxy, n-butoxy, n-pentoxy or n-hexoxy, alkylthio, preferably $C_1$–$C_6$ alkylthio, such as methylthio, ethylthio, propylthio, butylthio, pentylthio or hexylthio, halogen, such as fluorine, chlorine, bromine or iodine, amino groups, cyano groups, nitro groups or arylthio, such as phenylthio.

Examples of divalent, carbocyclic-aromatic $C_{12}$–$C_{18}$ radicals are biphenyl-2,2'-diyl.

Examples of preferred halogen atoms Q are chlorine or, in particular, fluorine. Preferred anions $LQ_n^-$ are $BF_4^-$, $PF_6^-$, $AsF_6^-$, $SbF_6^-$ and $SbF_5(OH)^-$.

In the context of this invention, the very particularly preferred metallocene initiators include the compounds of the formula XXI

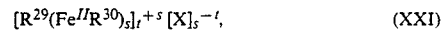

in which s is 1 or 2, t is 1, 2, 3, 4 or 5, X is a non-nucleophilic anion, $R^{29}$ is a $\pi$-arene and $R^{30}$ is an anion of a $\pi$-arene, preferably a cyclopentadienyl anion.

Examples of $\pi$-arenes $R^{29}$ and anions of $\pi$-arenes $R^{30}$ can be found in EP-A 94,915.

Examples of preferred $\pi$-arenes $R^{29}$ are toluene, xylene, ethylbenzene, cumene, methoxybenzene, methylnaphthalene, methoxynaphthalene, pyrene, perylene, stilbene, diphenylene oxide and diphenylene sulfide.

Cumene, methylnaphthalene or stilbene is very particularly preferred.

Examples of non-nucleophilic anions $X^-$ are $FSO_3^-$, anions of organic sulfonic acids, of carboxylic acids or anions $[LQ_n]^-$, as defined above.

Preferred anions are derived from partially fluorinated or perfluorinated aliphatic or partially fluorinated or perfluorinated aromatic carboxylic acids, or, in particular, form a partially fluorinated or perfluorinated aliphaitc or partially fluorinated or perfluorinated aromatic organic sulfonic acids, or are preferably anions $[LQ_n]^-$.

Examples of anions X are $BF_4^-$, $PF_6^-$, $AsF_6^-$, $SbF_6^-$, $SbF_5OH^-$, $CF_3^-$, $C_2F_5SO_3^-$, $n-C_3F_7SO_3^-$, $n-C_4F_9SO_3^-$, $n-C_6F_{13}SO_3^-$, $n-C_8F_{17}SO_3^-$, $C_6F_5SO_3^-$, phosphorus tungstate ($PO_{40}W_{12}^{3-}$) or silicon tungstate ($SiO_{40}W_{12}^{4-}$).

$PF_6^-$, $AsF_6^-$, $SbF_6^-$, $CF_3SO_3^-$, $C_2F_5SO_3^-$, $n-C_3F_7SO_3^-$, $n-C_4F_9SO_3^-$, $n-C_6F_{13}SO_3^-$ and $n-C_8F_{17}SO_3^-$ are preferred.

It is also possible to employ combinations of these metallocene salts with oxidants. Such combinations are described in EP-A 126,712.

In order to increase the light yield, sensitizers are preferably used, depending on the type of initiator.

Examples of sensitizers are polycyclic aromatic hydrocarbons or aromatic keto compounds. Specific examples of preferred sensitizers are mentioned in EP-A 153,904.

The mixture according to the invention can contain further additives (d1) or (c2) which are customary in the negative resist industry. Examples of such additives are wetting agents, flow agents, stabilizers, dyes, pigments, fillers, adhesion promoters, plasticizers and supplementary resins. Supplementary resins are generally used to modify the mechanical properties of the coating. Examples of these are vinyl copolymers based on styrene or acrylate, polyesters, polyamides or silicone resins. These supplementary resins are generally added in small amounts, preferably not more than 10% by weight, relative to the total mixture. They must be compatible with the other components of the mixture and should be soluble in organic solvents.

It is furthermore possible to add catalysts, accelerators and curing agents for the epoxide component to the mixtures. These additives cause post-curing of the epoxide component during any thermal aftertreatment; this post-curing step takes place, where appropriate, after development of the photoresist.

The compositions according to the invention preferably contain 10-90% by weight of the binder (a1), 5-80% by weight of the epoxy resin or vinyl ether (b1), 0.5-20% by weight of the photoinitiator (c1) and 0-15% by weight of the additives (d1). In each case, the proportions of the individual components add up to 100% and the amounts given relate to the total amount.

The compositions very particularly preferably contain 30-85% by weight of binder (a1), 10-60% by weight of epoxy or vinyl ether compound (b1), 1-10% by weight of photoinitiator (c1) and 0-10% by weight of additives (d1), in each case relative to the total amount.

The proportions of components (a2), (b2) and (c2) are preferably 99-70% by weight, 1-20% by weight and 0-10% by weight respectively, relative to the amount of (a2), (b2) and (c2) respectively.

To produce coatings, the individual components are dissolved in a suitable solvent. The choice of solvent and the concentration depend primarily on the nature of the components and on the coating method. The solvent should be inert, i.e. it should not undergo any chemical reaction with the components and it should be possible for it to be removed again during drying after coating.

Known coating methods are, for example: spin-coating, dipping, knife-coating, curtain coating, brushing, spraying or reverse-roll coating.

The composition according to the invention can furthermore be coated, as a dry film, by a temporary, flexible base on a substrate. A process of this type is described, for example, in EP-A 153,904.

The amount applied (coating thickness) and the type of substrate (coating base) depend on the desired field of application. It is particularly advantageous that the compositions according to the invention can be employed in very variable coating thicknesses. This coating thickness range covers values from about 0.5 $\mu$m to more than 100 $\mu$m.

Possible areas of applicat.ion for the compositions according to the invention are use as photoresists for electronics (galvanoresist, etch resist, solder-stop resist), the production of printing plates, such as offset printing plates or screenprinting forms, use in chemical milling, or use as a microresist in the production of integrated circuits.

Accordingly, the possible coating bases and the processing conditions of the coated substrates differ.

Films made from polyester or cellulose acetate or papers coated with plastic are used, for example, for photographic information recording; specially treated aluminium is used for offset printing forms, and copper-coated laminates are used for the production of printed circuits. The coating thicknesses are preferably about 0.5 to 10 $\mu$m for photographic materials and offset printing forms, and 1 to about 100 $\mu$m for printed circuits.

After coating, the solvent is generally removed by drying, and a photoresist coating on the base results.

The photosensitivity of the compositions according to the invention generally extends from the UV region (about 200 nm) to about 600 nm and thus covers a very broad range. The light sources used are therefore a large number of a very wide variety of types. Both point sources and planar lamps (lamp carpets) are suitable. Examples are: carbon arc lamps, xenon arc lamps, mercury vapour lamps, undoped or doped with metal halides (metal halide lamps), fluorescent lamps, incandescent argon lamps, electron flash lamps and photographic flood lamps.

The distance between the lamp and the image material according to the invention can vary depending on the application and on the lamp type or power, for example between 2 cm and 150 cm. Laser light sources, for example argon ion lasers or krypton ion lasers having strong emission lines (Ar lasers) at 457, 476, 488, 514 and 528 nm are specifically suitable. In this type of exposure, it is no longer necessary to have a photomask in contact with the photopolymer coating; the controlled laser beam writes directly onto the coating. The high sensitivity of the materials according to the invention is very advantageous here, permitting high write speeds at relatively low intensities. Printed circuits in the electronics industry, lithographic offset printing plates or relief printing plates and photographic image recording materials can be produced by this method.

After exposure of the material to an image and before development, it may be advantageous to carry out a thermal treatment for a short time. During this procedure, only the parts which have already been exposed are thermally post-cured. This thermal treatment is particularly advisable in the case of metallocene photoinitiators. It can be carried out in conventional ovens, for example in convection ovens, but also using IR irradiation, for example by irradiation with IR lasers, or in microwave equipment. The temperatures used are generally 50°–150° C., preferably 80°–130° C.; the curing time is generally between 1 and 15 minutes.

After exposure and, where appropriate, after thermal aftertreatment, the unexposed areas of the photoresist are removed in a manner known per se using a developer.

Particularly suitable developers are aqueous alkaline solutions, as also employed for the development of naphthodiazidequinone coatings. These include, in particular, solutions of the silicates, phosphates, hydroxides and carbonates of alkali metals. If desired, relatively small amounts of wetting agents and/or organic solvents can be added to these solutions.

Development using organic solvents is likewise possible. Cyclohexanone, 2-ethoxyethanol, acetone, MEK, and mixtures of these solvents, for example, are suitable.

After exposure and development, the relief image can again be subjected to thermal treatment (2nd step of thermal post-curing). During this procedure, the epoxy groups or vinyl ether groups remaining react with the phenolic hydroxyl groups of the binder or polymerize with themselves. For this purpose, the catalysts and accelerators which are customary in epoxy resin chemistry can be added as early as during the coating process (component d1 or c2), but must not interfere with the exposure.

By means of this additional thermal network formation, particularly resistant and durable relief images are obtained which are distinguished, like coatings of cured epoxy resins, by good thermomechanical, chemical and electrical properties, in particular stability, adhesion and high specific volume resistance.

The invention therefore also relates to a process for producing relief structures and comprising the following steps:

(a) coating of a substrate with a radiation-sensitive composition, as defined above,
(b) exposure of the coated substrate with a pre-determined pattern of actinic radiation, if desired
(c) thermal aftertreatment,
(d) development step and
(e) thermal aftertreatment of the developed system, if desired.

The term 'exposure with a pre-determined pattern of actinic radiation' includes both exposure through a photomask containing a pre-determined pattern, for example a diapositive, and exposure by a laser beam which is moved, for example, under computer control over the surface of the coated substrate and produces an image in this way.

The invention furthermore relates to a process for the production of protective coatings and comprising the following steps:

(a) coating of a substrate with a radiation-sensitive composition, as defined above,
(b) exposure of the radiation-sensitive coating over its entire surface and
(c) thermal aftertreatment of the exposed system, if desired.

In addition, the invention relates to the use of the above-defined compositions for the production of protective coatings and relief structures.

The following examples illustrate the invention:

(A) Preparation Examples

EXAMPLE 1

Preparation of 2,2'-dihydroxy-3,3'-dimethyl-5,5'-(2,3-epoxypropyl)diphenylmethane 1.1. Preparation of 2,2'-dihydroxy-3,3'-dimethyl-5,5'-diallyldiphenylmethane

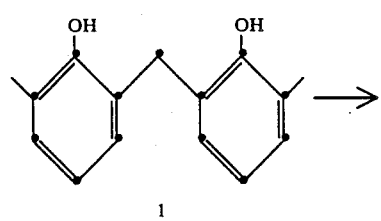

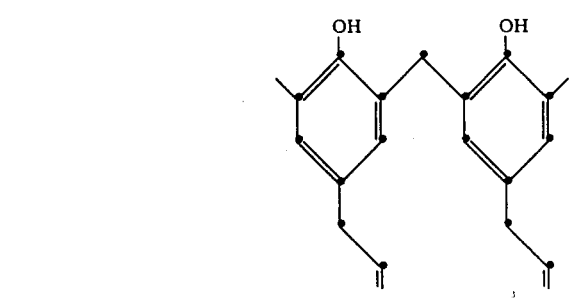

51.4 g (0.68 mol) of allyl chloride are added dropwise within 45 minutes at 70° C. to 45.6 g (0.2 mol) of 2,2'-dihydroxy-3,3'-dimethyldiphenylmethane 1 (prepared by the method of G. Casiraglie et al., Synthesis, 1981, 143) and 93.2 g (0.68 mol) of $K_2CO_3$ in 160 ml of DMF. After 3 hours, the reaction mixture is filtered and the solvent is removed by distillation. The residue is stirred at 160° C. for 18 hours. 58.1 g (94%) of crude product 2 are obtained and recrystallized twice from 50 ml of hexane. 39.0 g (63%) of 2 are obtained as beige crystals of melting point 89°–91° C.

1.2 Preparation of the diacetate of 2

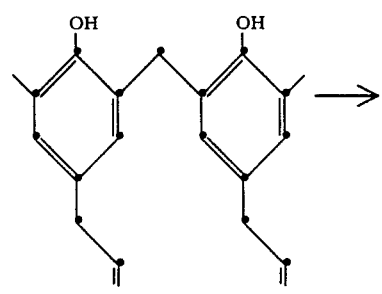

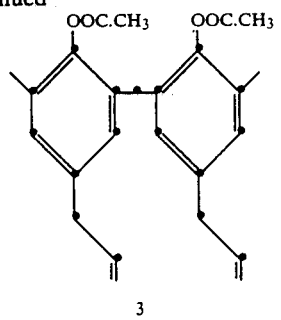

3

60 ml of acetic anhydride are added dropwise over the course of 20 minutes at room temperature to a solution of 38.8 g (0.12 mol) of 5,5'-diallyl-2,2'-dihydroxy-3,3'-dimethyldiphenylmethane 2 and 0.3 g of dimethylaminopyridine in 120 ml of pyridine. After 30 minutes, the reaction mixture is poured into 350 ml of $H_2O$, and the mixture is extracted 4 times with 100 ml of ethyl acetate. The combined organic phases are washed six times with 100 ml of $H_2O$, dried over $MgSO_4$, filtered and evaporated. 49.9 g (95%) of 3 are obtained as a clear brown liquid, which is used further without purification. $\eta^{80°\ C.} = 110$ mPa.s.

1.3 Epoxidization of the diacetate 3

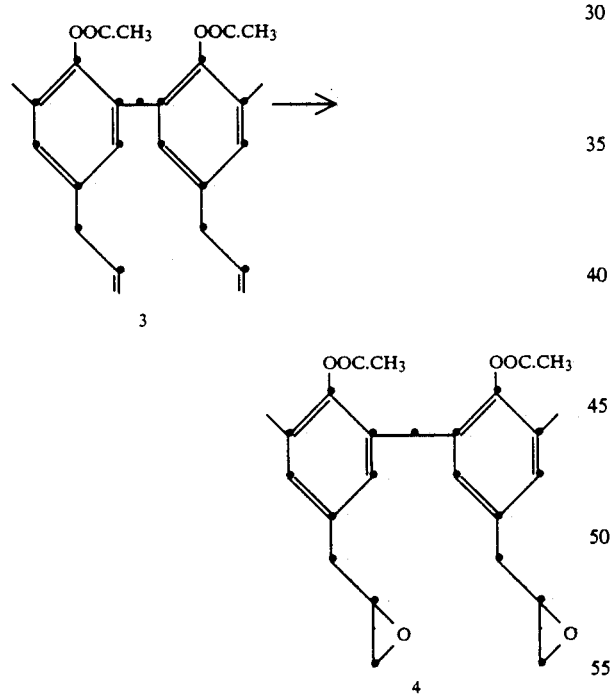

24.3 g (0.13 mol) of 40% peracetic acid in glacial acetic acid are added dropwise over the course of 30 minutes at 30° C. to 16.7 g (43 mmol) of 2,2'-diacetoxy-5,5'-diallyl-3,3'-dimethyldiphenylmethane 3 and 2.7 g of sodium acetate in 100 ml of $CH_2Cl_2$. After 20 hours, the reaction mixture is cooled, washed 2× with 25 ml of $H_2O$, 1× with 25 ml of 1 N NaOH, 2× with 25 ml of 10% $NH_4Cl$ solution and 1×25 ml of $H_2O$, dried over $MgSO_4$, freed from peroxide over $Na_2SO_3$, filtered and evaporated. 17.5 g (96%) of 4 are obtained as a clear, yellow liquid, which is further used without purification. $\eta^{80°\ C.} = 270$ mPa.s; epoxide number: 4.0 eq/kg (85%).

1.4. Saponification of the diacetate 4

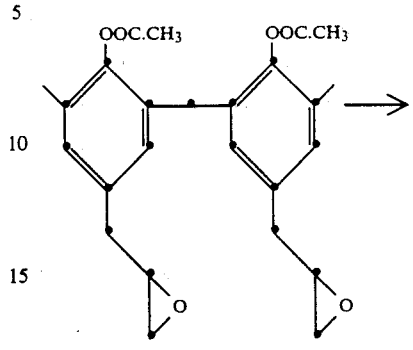

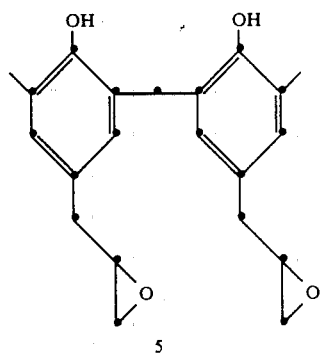

16.1 g of $K_2CO_3$ are added in three portions over the course of 15 minutes at 0° C. to 16.1 g (38 mmol) of 2,2'-diacetoxy-5,5'-diepoxypropyl-3,3'-dimethyldiphenylmethane 4 in 100 ml of absolute methanol. After 20 minutes, the reaction mixture is filtered, treated with 100 ml of $H_2O$ and adjusted to pH 6 using 10% $NaHSO_4$ solution. The precipitated product is filtered off and washed with $H_2O$. 11.5 g (89%) of 5 are obtained as beige crystals. Melting point 117°–119° C.; epoxide number: 5.2 eq/kg (88%).

(B) Use Examples

EXAMPLE I

A solution comprising 2.5 g of 2,2'-dihydroxy-3,3'-dimethyl-5,5'-(2,3-epoxypropyl)diphenylmethane, 5 g of cyclohexanone, 2.5 g of a p-vinylphenol polymer having $\overline{Mw}$ of 10,000, 0.1 g of ($\eta^6$ cumene)-($\eta^5$ cyclopentadienyl)iron(II) hexafluoroantimonate and 0.5 g of isopropylthioxanthone is applied to a copper-coated epoxy laminate using a 100 μm doctor blade. After drying for 10' at 100 degrees, a film of thickness 30 μm which can be photostructured is obtained. The film is exposed through a 21 step Stouffer Sensitivity Guide using a 5,000 W metal halide lamp (distance 50 cm) and subsequently cured for 20' at 110 degrees. After development in a solution comprising 37.5 g of sodium metasilicate * 5 $H_2O$ in 1,000 ml of water, the following numbers of steps are obtained:

| Exposure time: | 15" | 45" | 120" |
| --- | --- | --- | --- |
| Number of steps: | 2 | 4 | 6 |

What is claimed is:
1. A composition comprising

(a1) at least one solid, film-forming polyphenol which is soluble or at least swellable in aqueous alkaline media, (b1) at least one polyfunctional epoxy resin, one polyfunctional vinyl ether compound or at least one polyfunctional epoxy resin and one polyfunctional vinyl ether compound, each of which can be dissolved, in the uncured state, in an aqueous alkaline solution with salt formation, (c1) at least one cationic photoinitiator for component (b1).

2. A composition according to claim 1, in which the binder (a1) is selected from the group comprising
   (i) novolaks prepared from at least one phenol and at least one aldehyde,
   (ii) homopolymers and copolymers of alkenylphenols and
   (iii) homopolymers and copolymers of N-hydroxyphenylmaleiimides.

3. A composition according to claim 2, in which the novolak (i) is derived from a dinuclear or mononuclear substituted or unsubstituted phenol and a $C_1$-$C_6$ aldehyde or in which the homopolymer or copolymer of alkenylphenols (ii) contains the structural element of the formula I

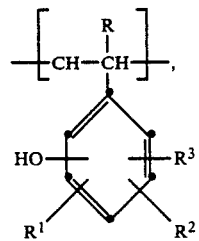

in which R is hydrogen or methyl, $R^1$, $R^2$ and $R^3$, independently of one another, are hydrogen, $C_1$-$C_4$ alkyl, $C_1$-$C_4$ alkoxy, halogen or methylol, or in which the homopolymer or copolymer of N-hydroxyphenylmaleiimide (iii) contains the structural element of the formula II

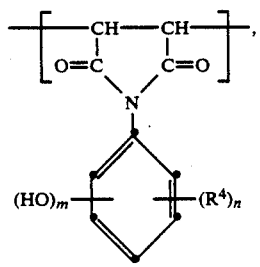

in which $R^4$ is $C_1$-$C_4$ alkyl, $C_1$-$C_4$ alkoxy or halogen, m is 1 or 2, n is 0, 1, 2, 3 or 4, and the sum of m and n is a maximum of 5, it being possible for the radicals $R^4$ of a phenyl ring to be different within the definitions given.

4. A composition according to claim 3, in which the binder (ii) is a copolymer based on alkenylphenols and vinyl compounds which are free of carboxyl groups or the binder (iii) is a copolymer based on N-hydroxyphenylmaleiimide and vinyl compounds which are free of carboxyl groups.

5. A composition according to claim 1, in which component (b1) is a phenol containing epoxypropyl side groups.

6. A composition according to claim 5, in which component (b1) is a compound of the formula XI

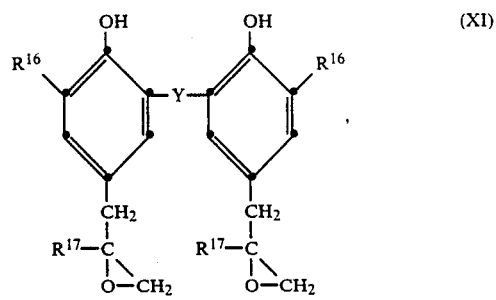

in which $R^{16}$ is $C_1$-$C_6$ alkyl, Y is a direct C—C bond or a —$CH_2$—, —$CH(CH_3)$—, —$C(CH_3)_2$—, —O—, —S—, —CO— or —$SO_2$— group, and $R^{17}$ is hydrogen or methyl; or in which component (b1) is a modified o-alkylphenol novolak of the formula XII

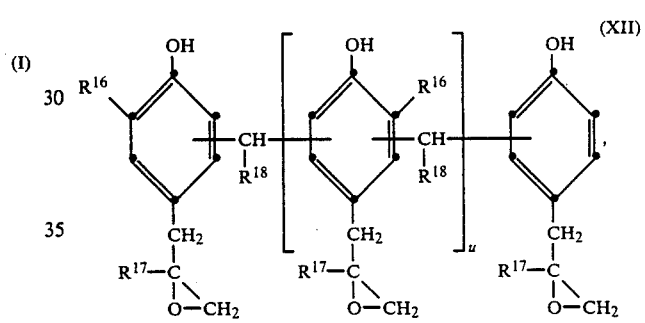

in which $R^{16}$ and $R^{17}$ are as defined above, $R^{18}$ is hydrogen or $C_1$-$C_6$ alkyl, and u is 1 to 6.

7. A composition according to claim 1, in which component (b1) is a modified phenol novolak consisting essentially of structural units of the formulae XIII and XIV

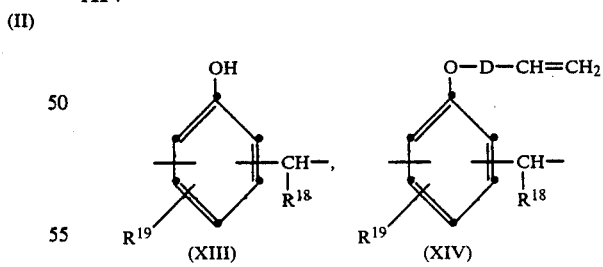

in which $R^{18}$ is as defined in claim 6, $R^{19}$ is hydrogen, $C_1$-$C_6$ alkyl, chlorine or bromine, D is a direct C—C bond or an -alkylene-O group having 2-12 C atoms, and where the number of structural units of the formula XIII is sufficiently large so that the uncrosslinked compound is soluble in an aqueous alkaline solution with salt formation; or in which component (b1) is a modified polyhydroxystyrene consisting essentially of structural units of the formulae XV and XVI or of structural units of the formulae XV and XVIII (XV)

$$-\overset{R^{20}}{\underset{|}{C}}-CH_2-$$
with phenyl ring bearing OH (XVI)

$$-\overset{R^{20}}{\underset{|}{C}}-CH_2-$$
with phenyl ring bearing O—D—CH=CH$_2$ (XVII)

$$-\overset{R^{20}}{\underset{|}{C}}-CH_2-$$
with phenyl ring bearing O—CH$_2$—C(R$^{21}$)(—CH$_2$—)O (epoxide)

in which R$^{20}$ and R$^{21}$, independently of one another, are hydrogen or methyl, D is as defined above, and where the number of structural units of the formula XV is sufficiently large so that the uncrosslinked compound is soluble in an-aqueous alkaline solution with salt formation.

8. A composition essentially comprising
(a2) a solid, film-forming polyphenol which is modified with epoxy or vinyl ether groups and which has a content of free phenolic hydroxyl groups such that the uncrosslinked polyphenol dissolves in an aqueous alkaline developer with salt formation and which has a content of epoxy or vinyl ether groups such that the crosslinked polyphenol is now virtually insoluble in the said developer,
(b2) a cationic photoinitiator for the polymerization of said epoxy or vinyl ether groups in component (a2), and (c2) customary additives, if desired.

9. A composition according to claim 8, in which component (a2) is a phenol novolak comprising 30–60% of structural units of the formula XVIII and 70–40% of structural units of the formula XIV according to claim 7, or a modified polyhydroxystyrene comprising 30–60% of structural units of the formula XV and 70–40% of structural units of the formula XVI according to claim 7, or a modified polyhyroxystyrene comprising 30–60% of structural units of the formula XV and 70–40% of structural units of the formula XVII according to claim 7, the percentages in each case relating to the total amount of structural units.

10. A composition according to claim 1, in which the photoinitiator (c1) is a compound of the formula XVIII $$[R^{29}(Fe^{II}R^{30})_s]_t{}^{+s}[X]_s{}^{-t}, \quad \text{(XVIII)}$$

in which s is 1 or 2, t is 1, 2, 3, 4 or 5, X is a non-nucleophilic anion, R$^{29}$ is a η-arene and R$^{30}$ is an anion of a η-arene.

11. A composition according to claim 8, in which the photoinitiator (b2) is a compound of the formula XVIII $$[R^{29}(Fe^{II}R^{30})_s]_t{}^{+s}[X]_s{}^{-t}, \quad \text{(XVIII)}$$

in which s is 1 or 2, t is 1, 2, 3, 4 or 5, X is a non-nucleophilic anion, R$^{29}$ is a η-arene and R$^{30}$ is an anion of a η-arene.

12. A compound of the formula XI (XI) — two phenol rings connected by Y, each bearing OH, R$^{16}$, and a —CH$_2$—C(R$^{17}$)—O—CH$_2$ group in which Y, R$^{16}$ and R$^{17}$ are as defined in claim 6.

13. A composition according to claim 1 further comprising customary additives.

14. A process for producing relief structures comprising the following steps:
(a) coating a substrate with a radiation-sensitive composition according to claim 1,
(b) exposure of the coated substrate with a pre-determined pattern of actinic radiation,
(c) development with an aqueous alkaline solution.

15. A process for producing relief structures comprising the following steps:
(a) coating a substrate with a radiation-sensitive composition according to claim 8,
(b) exposure of the coated substrate with a pre-determined pattern of actinic radiation,
(c) development with an aqueous alkaline solution.

16. A relief structure obtained with a process according to claim 14.

17. A relief structure obtained with a process according to claim 15.

* * * * *